(12) United States Patent  
Tseng et al.

(10) Patent No.: US 8,384,430 B2  
(45) Date of Patent: Feb. 26, 2013

(54) RC DELAY DETECTORS WITH HIGH SENSITIVITY FOR THROUGH SUBSTRATE VIAS

(75) Inventors: Nan-Hsin Tseng, Shanhua Township (TW); Chin-Chou Liu, Jhubei (TW); Wei-Pin Changchien, Taichung (TW); Pei-Ying Lin, Pingtung (TW); Ta-Wen Hung, Wugu Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 2 days.

(21) Appl. No.: 12/971,204

(22) Filed: Dec. 17, 2010

(65) Prior Publication Data

US 2012/0038388 A1 Feb. 16, 2012

Related U.S. Application Data

(63) Continuation-in-part of application No. 12/857,270, filed on Aug. 16, 2010.

(51) Int. Cl.  
*H03K 19/21* (2006.01)  
*H03K 17/00* (2006.01)

(52) U.S. Cl. ............... 326/52; 326/16; 326/35; 326/36

(58) Field of Classification Search ............ 326/52, 326/55, 9, 12, 14, 16, 93–95, 104; 327/208, 327/199, 261; 257/529  
See application file for complete search history.

(56) References Cited

U.S. PATENT DOCUMENTS

| | | | | |
|---|---|---|---|---|
| 5,701,090 A | * | 12/1997 | Hidaka et al. | 326/32 |
| 5,808,478 A | * | 9/1998 | Andresen | 326/31 |
| 7,482,831 B2 | | 1/2009 | Chakraborty et al. | |
| 7,508,882 B2 | * | 3/2009 | Adamiecki et al. | 375/291 |
| 7,999,584 B2 | * | 8/2011 | Rhee et al. | 327/156 |
| 8,211,747 B2 | * | 7/2012 | Kinzer et al. | 438/108 |
| 2009/0049331 A1 | | 2/2009 | Blome et al. | |
| 2009/0091333 A1 | * | 4/2009 | Chung et al. | 324/538 |
| 2009/0294983 A1 | * | 12/2009 | Cobbley et al. | 257/774 |
| 2010/0033453 A1 | * | 2/2010 | Park et al. | 345/204 |
| 2010/0244918 A1 | * | 9/2010 | Moyer et al. | 327/208 |
| 2010/0258917 A1 | * | 10/2010 | Lin | 257/621 |
| 2011/0006391 A1 | * | 1/2011 | Lee et al. | 257/529 |
| 2011/0121856 A1 | | 5/2011 | Tseng et al. | |
| 2011/0272814 A1 | * | 11/2011 | Wachtler et al. | 257/773 |
| 2012/0061804 A1 | * | 3/2012 | Kaskoun et al. | 257/621 |

OTHER PUBLICATIONS

Katti, Guruprasad et al.,Electrical Modeling and Characterization of Through Silicon via for Three-Dimensional ICs, Jan. 2010, IEEE Transactions on electron devices, vol. 57, No. 1, pp. 260.*

(Continued)

*Primary Examiner* — Rexford N Barnie  
*Assistant Examiner* — Crystal L Hammond  
(74) *Attorney, Agent, or Firm* — Slater & Matsil, L.L.P.

(57) ABSTRACT

A die includes a plurality of through-substrate vias (TSVs) penetrating a substrate of the die, wherein the plurality of TSVs are grouped as a plurality of TSV pairs. A plurality of contact pads is coupled to the plurality of TSVs, wherein the plurality of contact pads is exposed on a first surface of the die. The die further includes a plurality of balanced pulse comparison units, wherein each of the plurality of balanced pulse comparison units includes a first input and a second input coupled to a first TSV and a second TSV of one of the plurality of TSV pairs. The die further includes a plurality of pulse latches, each including an input coupled to an output of one of the plurality of balanced pulse comparison units.

24 Claims, 3 Drawing Sheets

OTHER PUBLICATIONS

Katti, G, et al. "Electrical Modeling and Characterization of Through Silicon via for Three-Dimensional ICs," IEEE Transactions on Electrical Devices, vol. 57, No. 1, Jan. 2010, pp. 256-262.*

Katti, G., et al., "Electrical Modeling and Characterization of Through Silicon via for Three-Dimensional ICs," IEEE Transactions on Electrical Devices, vol. 57, No. 1, Jan. 2010, pp. 256-262.

* cited by examiner

RC DELAY DETECTORS WITH HIGH SENSITIVITY FOR THROUGH SUBSTRATE VIAS

This application is a continuation-in-part of U.S. patent application Ser. No. 12/857,270, filed on Aug. 16, 2010, and entitled "System and Method for Detecting Soft-Fails," which application is incorporated herein by reference.

BACKGROUND

Generally, in integrated circuits, a soft-fail (or soft-failure) may be described as a minor defect in an electrical connection. The defect in the electrical connection may lead to an increase in electrical resistance through the electrical connection. Typically, the defect may result in an increase in the electrical resistance on the order of a few times to several thousand times the electrical resistance of a defect-free electrical connection.

The increase in the electrical resistance of the electrical connection may introduce additional delay to a signal propagation path containing the electrical connection. FIG. 1a illustrates two electrical signal paths, a first path 105 labeled "NORMAL" and a second path 110 labeled "HI-R." Signal path 105 includes through-silicon via (TSV) 106, and signal path 110 includes TSV 112. TSV 106 is a normal TSV with the resistance within design specification. The faulty TSV 112, which may include a micro void, has an electrical resistance higher than what design specification allows.

FIG. 1b illustrates three signal traces, a first trace 155 representing an input signal, a second trace 160 representing an electrical signal measured at an output of first path 105, and a third trace 165 representing an electrical signal measured at an output of second path 110. Both electrical signal paths shown in FIG. 1 are connected to the input signal labeled "IN." Both second trace 160 and third trace 165 arise from the input signal (first trace 155) that transition from a low electric potential to a high electric potential.

Due to an inherent electrical resistance of vias, an electrical signal propagating through first path 105 will experience a small propagation delay. However, the propagation delay is negligible. A rise time of the input signal propagating through first path 105 (shown as interval 175) may be substantially equal to a rise time of the input signal (shown as interval 170).

However, due to a significant increase in electrical resistance of second path 110, a rise time of the input signal propagating through second path 110 (shown as interval 180) may be substantially greater than a rise time of the input signal (shown as interval 170). Duration of interval 180 may be a function of the increase in electrical resistance due to the faulty via, with a greater increase in electrical resistance resulting in a greater duration of interval 180.

The increase in propagation delay due to a soft-fail may be detected directly by measuring the resistance of TSVs 106 and 112 shown in FIG. 1 by applying signal 155 to the input of each of the signal paths such as 105 and 112, and measuring the output signal. This method, however, suffers from the throughput problem since the detection has to be performed for each of the signal paths.

An alternative method for detecting likely fault in TSVs is to connect the TSVs as a daisy chain, and input a signal into the input of the daisy chain, and detect the output signal at the output of the daisy chain. Although the throughput may be improved by using this method, the accuracy of this method is degraded. For example, if one of the TSVs in the daisy chain has a soft-failure, and its resistance increases by tens of times, since the increase in the faulty TSV is averaged to a large number of TSVs, which may include hundreds of TSVs, the overall increase in the resistance of the entire daisy chain (and the resulting detected propagation delay of the daisy chain) may still be within the standard manufacturing tolerance, and may be acceptable. Accordingly, the soft-failure in the TSV may not be detectable.

BRIEF DESCRIPTION OF THE DRAWINGS

For a more complete understanding of the embodiments, and the advantages thereof, reference is now made to the following descriptions taken in conjunction with the accompanying drawings, in which:

FIG. 1b is a diagram of three signal traces as the input signals and output signals of the electrical signal paths in FIG. 1a;

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel method for detecting soft failures of electrical signal paths and the test circuit for performing the same are provided in accordance with an embodiment. The operation of the embodiment is then discussed. Throughout the various views and illustrative embodiments, like reference numbers are used to designate like elements. It is appreciated that although the embodiments are referred to as being used to detect soft failures, the embodiments may also be used to detect hard failures, wherein the broken signal paths can also be detected.

Figure 2:
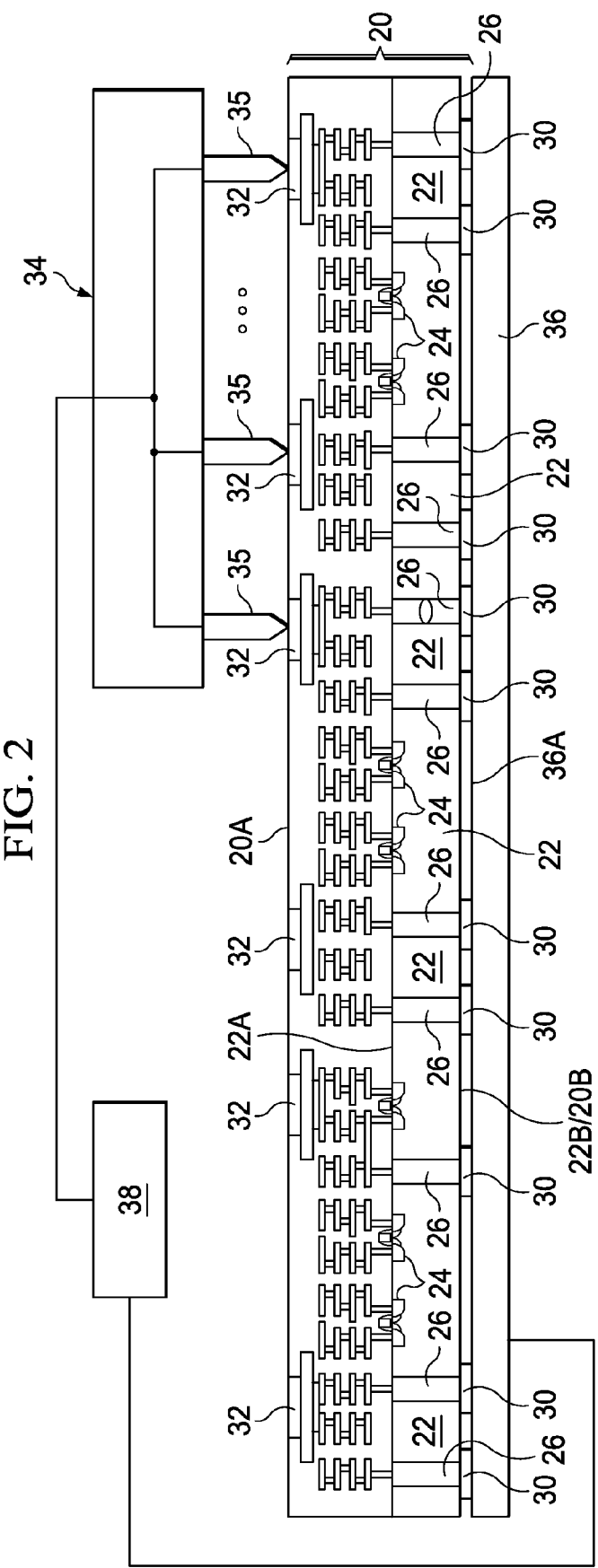
FIG. 2 illustrates a cross-sectional view of a die comprising a plurality of TSVs.

FIG. 2 is a cross-sectional view of die 20 in accordance with an embodiment. Die 20 may be a discrete die or a part of un-sawed wafer. Die 20 includes substrate 22, which may be a semiconductor substrate such as a silicon substrate. Integrated circuits 24, which are symbolized by transistors, are formed at front surface 22A of substrate 22. Through-substrate vias (TSVs, also known as through-silicon vias when formed in silicon substrates) 26 are formed in substrate 22, and extending from front surface 22A to back surface 22B of substrate 22. Contact pads 30 are formed on the back surface 20B of die, and are connected to TSVs 26. Contact pads 30 may also protrude beyond back surface 20B of die 20. Contact pads (which may also be bond pads) 32 are also formed on the front surface 20A of die 20. Some of contact pads 32 are electrically coupled to TSVs 26 and/or contact pads 30 through metal lines and vias that are formed on the front side and possibly on the back side of substrate 22.

Figure 3:
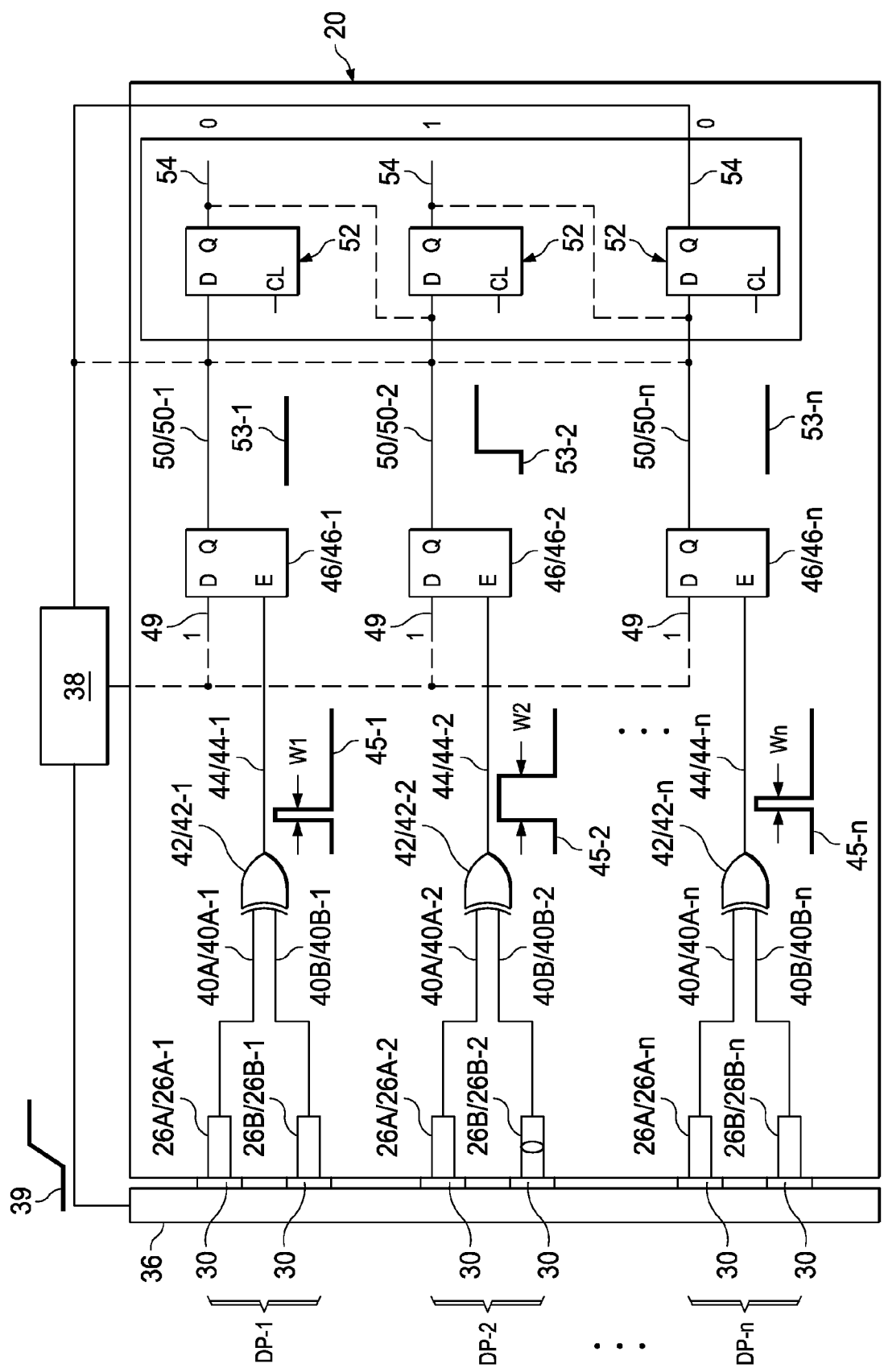
FIG. 3 illustrates a testing scheme, with the circuit diagram of the test circuit being illustrated.

In an embodiment, metal plate 36 contacts contact pads 30 so that an electrical signal may be provided to a plurality of contact pads 30 simultaneously. Metal plate 36 may have a flat surface 36A that is in contact with the plurality of contact pads 30. Metal plate 36 is further connected to failure detection circuit 38, which provides an input signal to metal plate 36 for detecting any soft or hard failure in TSVs 26. One or more of contact pads 32 may be used as output nodes for soft failure detection circuit 38 to extract output signals. Furthermore, a portion of contact pads 32 may be used for die 20 to switch between a normal operation mode and a soft failure detection mode, and for providing a power to the detection circuits (not shown in FIG. 2, please refer to circuits 42, 46, and 52 in FIG. 3) that are built in die 20. During the normal operation mode, detection circuits 42/46/52 as shown in FIG. 3 are disabled, and die 20 is configured to perform its normal operation. During the soft failure detection mode, detection circuits 42/46/52 are enabled for detecting soft failures in the electrical signal paths coupled to bond pads 30, while the normal operation of die 20 is disabled. In an embodiment, failure detection circuit 38 is electrically coupled to probe card 34 that includes a plurality of probes 35 contacting contact pads 32.

In alternative embodiments, metal plate 36 may be in contact with contact pads 32, while contact pads 30 are used for extracting the output signal, for switching the operation modes, and for providing the power used for the soft-failure detection.

FIG. 3 illustrates a circuit diagram of the built-in failure detection circuit built in die 20, which built-in failure detection circuit includes balanced pulse comparison units 42, pulse latches 46, and optionally scannable flip flops 52. TSVs 26 are located in die 20, and are grouped as pairs, wherein the TSVs in each pair are denoted as 26A and 26B. Throughout the description, TSV pairs 26 and the built-in failure detection circuits 42/46/52 (which are also represented by devices 24 in FIG. 2) that receive signals from the same TSV pair 26 are referred to as being in the same detection path. Accordingly, as shown in FIG. 3, there is a plurality of detection paths, namely DP1, DP2, . . . and DPn, with n representing the total number of TSV pairs, and may be any integer. Furthermore, TSVs 26 and the built-in failure detection circuits 42/46/52 in each of the detection paths DP1 through DPn may be postscripted with the sequence number of the respective detection paths. For example, The TSVs 26A and 26B in detection path DP2 may be referred to as TSVs 26A-2 and 26B-2, respectively. The plurality of TSVs in die 20 is connected to the same metal plate 36.

The two TSVs 26 in the same pair are electrically coupled to inputs 40A and 40B of a balanced pulse comparison unit 42, which functions essentially the same, and has the same truth table, as an exclusive-OR (XOR) gate. A truth table of balanced pulse comparison units 42 is shown in table 1.

| Input 40A | Input 40B | Output 44 |
|---|---|---|
| 0 | 0 | 0 |
| 0 | 1 | 1 |
| 1 | 0 | 1 |
| 1 | 1 | 0 |

Balanced pulse comparison unit 42 is also referred to as an XOR equivalent circuit. Output 44 of balanced XOR equivalent circuit 42 is electrically coupled to an input of pulse latch 46. The other input 49 of pulse latch 46 is connected to a logic high signal, which signal may be provided by failure detection circuit 38, for example. The output signal on output 50 of pulse latch 46 may be used to determine whether a soft failure occurs in one of the respective TSV pair 26A/26B. In an embodiment, outputs 50 of pulse latches 46 are connected to the inputs of scannable flip flops 52. Pulse latches 46 are configured to latch the logic signal at input "D" to output "Q" (output 50) if the input pulse at the enable node "E" has a pulse width greater than or equal to a certain pre-determined pulse width. Conversely, if the input pulse at the enable node "E" has a pulse width smaller than the pre-determined pulse width, a logic low signal remains at output 50.

Figure 1A:
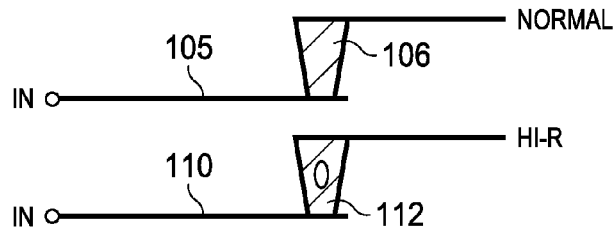
FIG. 1a is a diagram of two electrical signal paths.
Figure 1B:
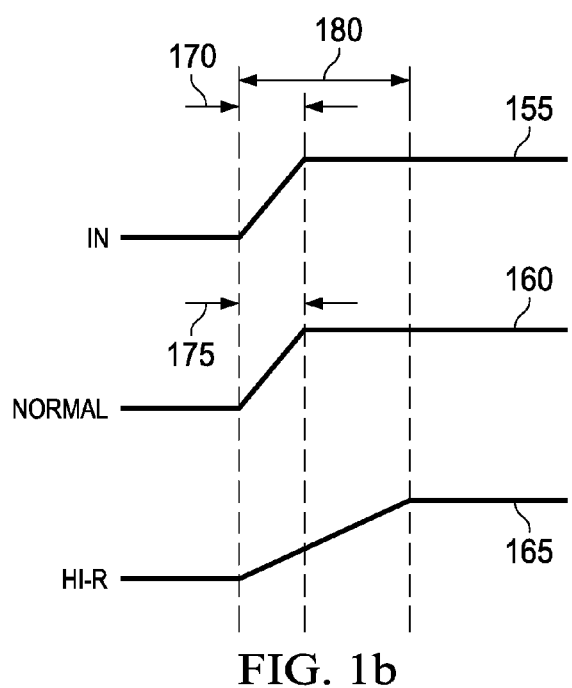
Figure 4:
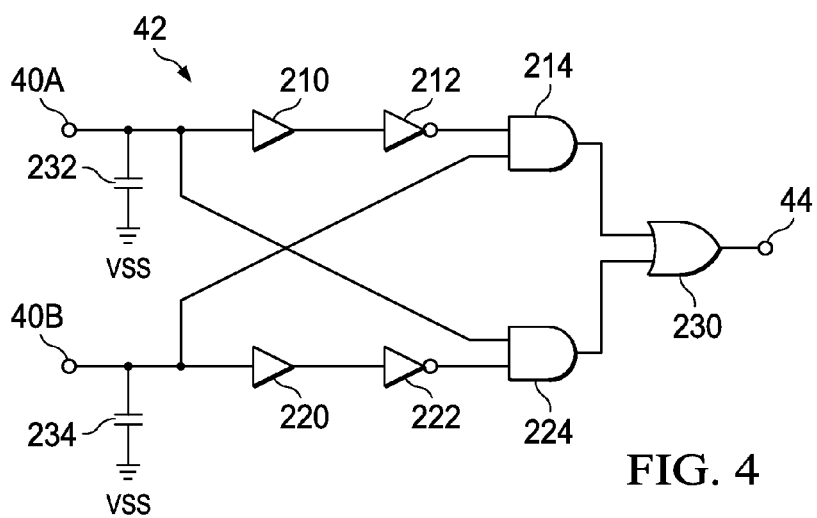
FIG. 4 illustrates a circuit implementation of a balanced pulse comparison unit used in the test circuit.

FIG. 4 illustrates a circuit diagram, which is a logic implementation of balanced pulse comparison unit 42. Using the signal at inputs 40A and 40B, balanced pulse comparison unit 42 may produce an output signal based on a relative timing between inputs 40A and 40B, which relative timing is the timing difference in the rising edges of the signals at inputs 40A and 40B. Balanced pulse comparison unit 42 may produce at its output 44 a logical high value if signals at its two inputs 40A and 40B are different, while, if signals at its two inputs are equal, then pulse comparison unit 42 may produce a logical low value at its output 44. The exemplary output signal of balanced pulse comparison units 42 are shown in FIG. 3 as signals 45-1, 45-2, through 45-n. Output signals 45-1, 45-2, through 45-n are pulses, and pulse widths W1, W2, and W3 are determined by the timing difference in the rising edges of the signals at inputs 40A and 40B.

Referring again to FIG. 4, balanced pulse comparison unit 42 includes buffer 210 and inverter 212 coupled in series to input 40A. The output of inverter 212 is further connected to an input of AND gate 214. Buffer 220 and inverter 222 are coupled in series to input 40B. The output of inverter 222 is further connected to an input of AND gate 224. AND gate 214 further includes an additional input coupled to input 40B. AND gate 224 further includes an additional input coupled to input 40A. The outputs of AND gates 214 and 224 are connected to the inputs of OR gate 230, whose output is also provided to output 44 of balanced pulse comparison unit 42.

Inputs 40A and 40B of balanced pulse comparison unit 42 are balanced, which means if there are two signals to be input into balanced pulse comparison unit 42, the output signal generated by inputting the first signal into 40A and the second signal into 40B will be identical to the output signal generated by inputting the first signal into 40B and the second signal into 40A. As a comparison, if the same signals are provided to a conventional XOR gate, since the inputs of a conventional XOR gate are coupled to the gates of cascaded transistors, the output signal generated by inputting the first signal into 40A and the second signal into 40B will be slightly different from the output signal generated by inputting the first signal into 40B and the second signal into 40A.

Capacitors 232 and 234 are coupled to inputs 40A and 40B, and are coupled between the respective inputs 40A and 40B and a VSS node, which may be an electrical ground. Capacitors 232 and 234 may be used to adjust the sensitivity in the detection of soft failures. By adding capacitors 232 and 234, a smaller difference in the resistances of TSVs 26A and 26B that are in the same TSV group may be detected. In an exemplary embodiment, the capacitances of capacitors 232 and 234 are the same, and may be, for example, about 300 pF. As a result, a difference of 27 ohms between the resistances of TSVs 26A and 26B was detected in simulations, and the output of the respective pulse latch 46 outputted a logic high signal. Conversely, when the resistance difference is 25 ohms, the resistance difference was not detected, and the output of the respective pulse latch 46 outputted a logic low signal. As a comparison, if capacitors 232 and 234 are not added, a resistance difference greater about 3 k ohms were detectable, while smaller resistance differences were not detectable. Therefore, the addition of capacitors 232 and 234 results in the improvement in the sensitivity of the soft-failure detection.

Referring back to FIG. 3, detection circuit 38 provides an input signal 39 to metal plate 36, and hence the TSV pairs 26 that are connected to metal plate 36 receive the same input signal 39. In an embodiment, input signal 39 includes a rising edge. Due to the low resistance of metal plate 36 and the short distances between different TSV pairs, it may be assumed that input signal 39 received by all TSV pairs are identical, particularly for the input signals received by TSVs 26A and 26B in the same TSV pair.

A detection of soft failure is discussed as follows. In the following example, it is assumed that TSVs 26A-1 and 26B-1 that are in detection path DP1 do not have soft failures, while TSV 26B-2 in detection path DP1 has a micro void therein, hence a soft failure. TSV 26A-2 in detection path DP2 also does not have any soft failure. When input signal 39 is provided to metal plate 36, signal 45-1 is generated at output 44-1 of balanced pulse comparison unit 42-1. Due to the relatively small difference between the resistances of TSVs 26A-1 and 26B-1, pulse width W1 of signal 45-1 is relatively small, and is not wide enough to enable pulse latch 46-1. As a result, the output signal 53-1 at output 50-1 of pulse latch 46-1 is a logic low ("0"), indicating that the resistances of TSVs 26A-1 and 26B-1 are close, and there is no soft failure in either of TSVs 26A-1 and 26B-1.

When input signal 39 is provided to metal plate 36, signal 45-2 is also generated at output 44-2 of balanced pulse comparison unit 42-2. Due to the relatively big difference between the resistances of TSVs 26A-2 and 26B-2, the pulse width W2 of output signal 45-2 is great enough to enable pulse latch 46-2. As a result, the output signal 53-2 at output 50 of pulse latch 46-2 becomes logic high ("1"), indicating that the resistances of TSVs 26A-1 and 26B-1 are different from each other, and at least one of TSVs 26A-1 and 26B-1 has a soft failure.

At the time output signals are generated at the outputs of pulse latches 46-1 and 46-2, output signals are also generated at the outputs of other pulse latches 46. The outputs of pulse latches 46 may be directly connected to, and may be extracted from, contact pads 32 as shown in FIG. 2. Alternatively, the outputs of pulse latches 46 may be provided to inputs of scannable flip flops 52, which may be coupled in series as a chain, with the output 54 of one scannable flip flop 52 (for example, 52-1) connected to the input of another scannable flip flop 52 (for example, 52-2). The outputs signals of scannable flip flops 52 may then be extracted as a serial data series of logic signals. The providing of input signals and the extraction of output signals from either the outputs of pulse latches 46 or from scannable flip flops 52 may be controlled by failure detection circuit 38, which may also extract the detection results from nodes 50 without using scannable flip flops 54. The dotted lines in FIG. 3 illustrate the corresponding connections between failure detection circuit 38 and outputs 50.

By using the embodiments, essentially all TSVs in die 20 may be connected to a detection circuit, and hence essentially all TSVs may be detected, if needed, for possible soft failures and hard failures. With the scannable flip flops 52, failure detection circuit 38 is able to extract the results of the detection as a series of logic high signals and logic low signals, without the need to move probe pins from one TSV to another. The throughput for the detection is thus high.

In accordance with embodiments, a die includes a plurality of through-substrate vias (TSVs) penetrating a substrate of the die, wherein the plurality of TSVs are grouped as a plurality of TSV pairs. A plurality of contact pads is coupled to the plurality of TSVs, wherein the plurality of contact pads is exposed on a first surface of the die. The die further includes a plurality of balanced pulse comparison units, wherein each of the plurality of balanced pulse comparison units includes a first input and a second input coupled to a first TSV and a second TSV of one of the plurality of TSV pairs. The die further includes a plurality of pulse latches, each including an input coupled to an output of one of the plurality of balanced pulse comparison units.

In accordance with other embodiments, a device includes a substrate; a first TSV and a second TSV penetrating the substrate; and a balanced pulse comparison unit including a first input and a second input coupled to the first and the second TSVs, respectively. The balanced pulse comparison unit has a truth table same as a truth table of an exclusive-OR gate, wherein the first input and the second input are balanced inputs. A pulse latch includes an input coupled to an output of the balanced pulse comparison unit. The pulse latch is configured to latch a logic high signal in response to a pulse at the input.

In accordance with yet other embodiments, a method includes contacting a metal plate to a first and a second contact pad of a die. The first and the second contact pads are coupled to a first end of a first TSV and a first end of a second TSV, respectively, in the die. An input signal having an edge is supplied to the metal plate. Output signals are supplied to a balanced pulse comparison unit to generate a pulse, wherein the output signals are resulting signals of the input signal on second ends of the first and the second TSVs. A pulse latch is used to receive the pulse and to generate an output signal, wherein the pulse latch is configured to output a logic high signal in response to the pulse having a pulse width greater than a pre-determined pulse width, and output a logic low signal in response to the pulse having a pulse width smaller than the pre-determined pulse width.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a die comprising:
      a plurality of through-substrate vias (TSVs) penetrating a substrate of the die, wherein the plurality of TSVs are grouped as a plurality of TSV pairs;
      a plurality of contact pads coupled to the plurality of TSVs, wherein the plurality of contact pads is exposed on a first surface of the die;
      a plurality of balanced pulse comparison units, wherein each of the plurality of balanced pulse comparison units comprises a first input and a second input coupled to a first TSV and a second TSV of one of the plurality of TSV pairs, wherein the first and the second inputs of each of the plurality of balanced pulse comparison units are balanced inputs; and a plurality of pulse latches, each comprising an input coupled to an output of one of the plurality of balanced pulse comparison units.

2. The device of claim 1, wherein the plurality of balanced pulse comparison units has truth tables same as truth tables of exclusive-OR gates.

3. The device of claim 2, wherein each of the plurality of balanced pulse comparison units comprises:
   a first buffer and a second buffer;
   a first inverter and a second inverter serially coupled to an output of the first buffer and an output of the second buffer, respectively;
   a first AND gate comprising a first input coupled to an output of the first inverter, and a second input coupled to an input of the second buffer;
   a second AND gate comprising a first input coupled to an output of the second inverter, and a second input coupled to an input of the first buffer; and
   an OR gate comprising a first input coupled to an output of the first AND gate, and a second input coupled to an output of the second AND gate.

4. The device of claim 3 further comprising a first capacitor coupling the input of the first buffer to an electrical ground, and a second capacitor coupling the input of the second buffer to the electrical ground.

5. The device of claim 1 further comprising a plurality of scannable flip flops, each comprising an input coupled to an output of one of the plurality of pulse latches, wherein a signal at the input is configured to be an output signal from the output of the one of the plurality of pulse latches.

6. The device of claim 1 further comprising:
   a conductive feature electrically shorting the plurality of contact pads; and
   a detection circuit coupled to the conductive feature, wherein the detection circuit is configured to generate an input signal, and provide the input signal to the plurality of TSV pairs through the conductive feature, with the input signal comprising a rising edge.

7. The device of claim 6, wherein the detection circuit is further coupled to, and configured to detect output signals of, the plurality of pulse latches.

8. The device of claim 6 further comprising a probe card comprising probes contacting additional contact pads on a second surface of the die and electrically coupled to the detection circuit, wherein the additional contact pads are electrically coupled to the plurality of TSVs, and wherein the first and the second surfaces are opposite surfaces of the die.

9. The device of claim 1, wherein the input of the each of the plurality of pulse latches is configured to receive an output signal at the output of the one of the plurality of balanced pulse comparison units, and wherein the input of the each of the plurality of pulse latches is an enable node.

10. The device of claim 1, wherein the first and the second inputs of a same one of the plurality of balanced pulse comparison units are configured to receive signals that are at output ends of a first and a second TSV in a same one of the plurality of TSV pairs.

11. The device of claim 1, wherein the plurality of balanced pulse comparison units is configured to be disabled and enabled in response to an operation mode of the die.

12. A device comprising:
   a substrate;
   a first through-substrate via (TSV) and a second TSV penetrating the substrate;
   a balanced pulse comparison unit comprising a first input and a second input coupled to the first and the second TSVs, respectively, wherein the balanced pulse comparison unit has a truth table same as a truth table of an exclusive-OR gate, and wherein the first input and the second input are balanced inputs; and
   a pulse latch comprising an input coupled to an output of the balanced pulse comparison unit, wherein the pulse latch is configured to latch a logic high signal in response to a pulse at the input.

13. The device of claim 12, wherein the first TSV comprises:
   a first end coupled to a contact pad protruding out of a surface of a respective die, with the die comprising the substrate, the balanced pulse comparison unit, and the pulse latch; and
   a second end coupled to the first input of the balanced pulse comparison unit, wherein no additional TSV is coupled between the second end and the first input of the balanced pulse comparison unit.

14. The device of claim 12, wherein the balanced pulse comparison unit comprises a first capacitor coupling the first input of the balanced pulse comparison unit to a VSS node, and a second capacitor coupling the second input of the balanced pulse comparison unit to the VSS node.

15. The device of claim 12 further comprising a scannable flip flop comprising an input coupled to an output of the pulse latch, wherein the input of the scannable flip flop is configured to receive an output signal at an output of the pulse latch.

16. The device of claim 12 further comprising:
   a plurality of TSVs penetrating the substrate;
   a plurality of balanced pulse comparison units, each identical to the balanced pulse comparison unit and comprising a first input and a second input coupled to the plurality of TSVs in the substrate, wherein the first and the second inputs of each of the plurality of balanced pulse comparison units are configured to receive same signals that are at ends of the respective ones of the plurality of TSVs; and
   a plurality of pulse latches, each identical to the pulse latch and comprising an input coupled to an output of one of the plurality of balanced pulse comparison units.

17. The device of claim 12, wherein the first and the second inputs of a same one of the balanced pulse comparison unit are configured to receive signals that are at output ends of the first and the second TSVs.

18. The device of claim 12, wherein the balanced pulse comparison unit and the pulse latch are configured to be disabled and enabled in response to an operation mode of a die that comprises the balanced pulse comparison unit and the pulse latch.

19. A method comprising:
   electrically shorting a first end of a first through-substrate via (TSV) and a first end of a second TSV in a die using a conductive feature,
   supplying an input signal comprising an edge to the first ends of the first and the second TSVs through the conductive feature;
   supplying output signals to a balanced pulse comparison unit to generate a pulse, wherein the output signals are resulting signals of the input signal on second ends of the first and the second TSVs; and
   using a pulse latch to receive the pulse and to generate an output signal, wherein the pulse latch is configured to output a logic high signal in response to the pulse having a pulse width greater than a pre-determined pulse width, and output a logic low signal in response to the pulse having a pulse width smaller than the pre-determined pulse width.

20. The method of claim 19, wherein the die further comprises a plurality of TSVs grouped as a plurality of TSV pairs, wherein each of the plurality of TSV pairs is coupled to one of a plurality of balanced pulse comparison units identical to the balanced pulse comparison unit, and is coupled to one of a plurality of pulse latches identical to the pulse latch.

21. The method of claim 20, wherein the conductive feature contacts the plurality of TSVs simultaneously at a time the input signal is provided, and wherein the method further comprises extracting output signals from the pulse latch and the plurality of pulse latches.

22. The method of claim 21, wherein the step of extracting the output signals comprises using a plurality of scannable flip flops to receive the output signals and to output the output signals as a serial data.

23. The method of claim 20, wherein each of the plurality of pulse latches comprises a first input coupled to an input of one of the plurality of balanced pulse comparison units, and a second input coupled to a logic high signal.

24. The method of claim 19, wherein inputs of the balanced pulse comparison unit are balanced inputs.

* * * * *